United States Patent
Kim et al.

(10) Patent No.: US 11,408,063 B2
(45) Date of Patent: Aug. 9, 2022

(54) MASK FRAME ASSEMBLY AND METHOD OF MANUFACTURING THE SAME

(71) Applicant: Samsung Display Co., Ltd.

(72) Inventors: Minseok Kim, Yongin-si (KR); Junghyun Ahn, Yongin-si (KR); Jongdae Lee, Yongin-si (KR); Wonyoung Jang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 315 days.

(21) Appl. No.: 16/516,176

(22) Filed: Jul. 18, 2019

(65) Prior Publication Data

US 2020/0102637 A1   Apr. 2, 2020

(30) Foreign Application Priority Data

Sep. 28, 2018  (KR) .......................... 10-2018-0116085

(51) Int. Cl.
| | |
|---|---|
| *B23K 28/00* | (2006.01) |
| *C23C 14/04* | (2006.01) |
| *H01L 51/00* | (2006.01) |
| *H01L 27/32* | (2006.01) |

(52) U.S. Cl.
CPC ............ *C23C 14/042* (2013.01); *B23K 28/00* (2013.01); *H01L 27/3244* (2013.01); *H01L 51/0011* (2013.01)

(58) Field of Classification Search
CPC .................................................. B23K 31/003
See application file for complete search history.

(56) References Cited

U.S. PATENT DOCUMENTS

| | | | |
|---|---|---|---|
| 8,925,480 B2 * | 1/2015 | Kim ................. | B05C 21/005 |
| | | | 118/504 |
| 9,141,001 B2 * | 9/2015 | Kim ................. | G03F 7/70733 |
| 9,238,276 B2 * | 1/2016 | Kang ............... | B23K 11/10 |
| 9,761,802 B2 | 9/2017 | Kuriyama et al. | |
| 2010/0192856 A1 * | 8/2010 | Sung ................. | H01L 51/0011 |
| | | | 118/721 |

(Continued)

FOREIGN PATENT DOCUMENTS

| | | |
|---|---|---|
| JP | 11-245307 | 9/1999 |
| JP | 2005-339858 | 12/2005 |

(Continued)

OTHER PUBLICATIONS www.twi-global.com, "Distortion Control—Prevention by fabrication techniques", http://www.twi-global.com/technical-knowledge/job-knowledge/distortion-control-prevention-by-fabrication-techniques-036/, Oct. 23, 2015 (Year: 2015).*

(Continued)

*Primary Examiner* — Erin B Saad
*Assistant Examiner* — Carlos J Gamino
(74) *Attorney, Agent, or Firm* — H.C. Park & Associates, PLC

(57) ABSTRACT

A method of manufacturing a mask frame assembly includes: welding fixing ends of a long-side support bar on a frame; and fixing a mask having a pattern area to be divided by the long-side support bar, on the frame, wherein the welding of the fixing ends of the long-side support bar on the frame includes forming welds asymmetrically with respect to a longitudinal central axis of the fixing ends.

12 Claims, 9 Drawing Sheets

(56) References Cited

U.S. PATENT DOCUMENTS

| | | | |
|---|---|---|---|
| 2011/0139069 A1* | 6/2011 | Ahn | G03F 1/20 |
| | | | 118/504 |
| 2011/0146573 A1* | 6/2011 | Park | C23C 14/042 |
| | | | 118/712 |
| 2011/0220019 A1* | 9/2011 | Lee | C23C 14/042 |
| | | | 118/504 |
| 2012/0279444 A1* | 11/2012 | Hong | C23C 14/042 |
| | | | 118/504 |
| 2014/0331926 A1* | 11/2014 | Kim | C23C 14/042 |
| | | | 118/504 |
| 2015/0007767 A1* | 1/2015 | Ko | B05B 12/29 |
| | | | 118/504 |
| 2015/0101536 A1* | 4/2015 | Han | C23C 14/042 |
| | | | 118/721 |
| 2016/0260935 A1* | 9/2016 | Lee | C23C 14/042 |
| 2017/0207390 A1* | 7/2017 | Kim | C23C 14/24 |
| 2017/0222145 A1* | 8/2017 | Kim | H01L 51/0011 |
| 2017/0268093 A1* | 9/2017 | Ji | C23C 14/042 |
| 2017/0365822 A1* | 12/2017 | Kim | H01L 51/56 |
| 2018/0026189 A1* | 1/2018 | Kim | C23C 14/042 |
| | | | 438/401 |
| 2019/0157562 A1 | 5/2019 | Kim et al. | |
| 2021/0060700 A1* | 3/2021 | Okamoto | B23K 26/32 |
| 2021/0249603 A1* | 8/2021 | Kim | C23C 14/24 |

FOREIGN PATENT DOCUMENTS

| | | |
|---|---|---|
| JP | 2015-036451 | 2/2015 |
| KR | 10-0705317 | 4/2007 |
| KR | 10-1655993 | 9/2016 |
| KR | 10-2018-0007430 | 1/2018 |

OTHER PUBLICATIONS

Caron, "How to Fix Welding Heat Distortion—Kevin Caron", https://www.youtube.com/watch?v=_FU_YzSfk0s , Dec. 14, 2016 (Year: 2016).*

* cited by examiner

MASK FRAME ASSEMBLY AND METHOD OF MANUFACTURING THE SAME

CROSS-REFERENCE TO RELATED APPLICATION

This application claims priority from and the benefit of Korean Patent Application No. 10-2018-0116085, filed on Sep. 28, 2018, which is hereby incorporated by reference for all purposes as if fully set forth herein.

BACKGROUND

Field

Exemplary embodiments of the invention relate generally to a mask frame assembly used for thin film deposition, and to a method of manufacturing the mask frame assembly.

Discussion of the Background

Generally, an organic light-emitting display apparatus is capable of realizing a color based on a principle in which holes and electrons injected from an anode and a cathode are re-united in an emission layer to emit light, and pixels of the organic light-emitting display apparatus have a stack-type structure in which the emission layer is arranged between a pixel electrode, which is the anode, and an opposite electrode, which is the cathode.

Each of the pixels may be a sub-pixel of any of, for example, a red pixel, a green pixel, and a blue pixel, and an intended color may be realized via a color combination of the sub-pixels of these three color pixels. That is, each sub-pixel may have a structure in which an emission layer emitting light of any one color among red, green, and blue is arranged between two electrodes, and a color of a unit pixel may be realized via an appropriate combination of the lights of these three colors.

Meanwhile, the electrodes, the emission layer, etc., of the organic light-emitting display apparatus may be formed by using deposition. That is, a mask frame assembly having the same pattern as a thin layer to be formed may be arranged on a substrate and a raw material of the thin layer may be deposited on the substrate by using the mask frame assembly to form the thin layer having an intended pattern.

The above information disclosed in this Background section is only for understanding of the background of the inventive concepts, and, therefore, it may contain information that does not constitute prior art.

SUMMARY

A long-side support bar for dividing a pattern area of a mask into unit cell patterns is provided in the mask frame assembly, but when the long-side support bar is deformed in an assembling process, it is impossible to deposit a proper pattern. Furthermore, recently, the unit cell pattern has been formed to have an asymmetric shape including a trench shape at a side thereof, and thus, the long-side support bar defining the shape has also been formed to have an asymmetric shape. Thus, it is even more likely that the long-side support bar is deformed during an assembling process, which requires a solution.

Accordingly, one or more exemplary embodiments include a mask frame assembly improved to effectively cope with deformation of a long-side support bar and a method of manufacturing the mask frame assembly.

Additional aspects will be set forth in part in the description which follows and, in part, will be apparent from the description, or may be learned by practice of the presented exemplary embodiments.

According to one or more exemplary embodiments, a method of manufacturing a mask frame assembly includes: welding fixing ends of a long-side support bar on a frame; and fixing a mask having a pattern area to be divided by the long-side support bar, on the frame, wherein the welding of the fixing ends of the long-side support bar on the frame includes forming welds asymmetrically with respect to a longitudinal central axis of the fixing ends.

The welding of the fixing ends of the long-side support bar on the frame may further include measuring a degree of bending deflection of the long-side support bar, and the forming of the welds asymmetrically with respect to the longitudinal central axis of the fixing ends may be performed to correct the degree of bending deflection.

The method may further include: calculating the number of asymmetric welds for correcting the measured degree of bending deflection; and the forming of the welds asymmetrically with respect to the longitudinal central axis of the fixing ends is performed according to the calculated number of asymmetric welds.

The calculating of the number of asymmetric welds for correcting the measured degree of bending deflection may include calculating the number of asymmetric welds based on $y=25.009 \ln(x)+2.5187$ [y is the degree of bending deflection (μm) and x is the number of asymmetric welds].

The measuring of the degree of bending deflection of the long-side support bar, the calculating of the number of asymmetric welds for correcting the measured degree of bending deflection, and the forming of the welds asymmetrically with respect to the longitudinal central axis of the fixing ends may be repeatedly performed a plurality of times to gradually correct the degree of bending deflection.

The method may further include, when the number of asymmetric welds to be formed exceeds a pre-set correction limit based on the measuring of the degree of bending deflection of the long-side support bar, generating a defect signal.

The method may further include, when the asymmetric welds are beyond the longitudinal central axis of the fixing ends, regarding it as exceeding the correction limit.

The asymmetric welds may be serially formed in a width direction of the fixing ends.

The method may further include forming welds symmetrically with respect to the longitudinal central axis of the fixing ends.

The measuring of the degree of bending deflection may be performed after the forming of the welds symmetrically with respect to the longitudinal central axis of the fixing ends.

The long-side support bar may have both sides having an asymmetric shape, based on the longitudinal central axis.

The welding of the fixing ends of the long-side support bar on the frame may further include pulling the long-side support bar having the asymmetric shape and welding the long-side support bar on the frame.

The welding of the fixing ends of the long-side support bar on the frame may include mounting the mask to perpendicularly intersect with the long-side support bar.

According to one or more exemplary embodiments, a mask frame assembly includes: a frame, a mask coupled to the frame and having a pattern area for deposition, and a long-side support bar coupled to the frame and dividing the pattern area of the mask into unit cell patterns, wherein the long-side support bar includes a pair of fixing ends welded to opposite sides of the frame and a pattern division portion connecting the pair of fixing ends and dividing the pattern area, and an asymmetric welding portion is provided in the pair of fixing ends, wherein the asymmetric welding portion includes welds asymmetrically arranged with respect to a longitudinal central axis of the pair of fixing ends.

The welds may be arranged at only one side of the asymmetric welding portion, with respect to the longitudinal central axis of the pair of fixing ends.

The welds may be linearly arranged in the asymmetric welding portion in a width direction of the pair of fixing ends.

A symmetric welding portion may further be provided in the pair of fixing ends, wherein the symmetric welding portion includes welds symmetrically arranged with respect to the longitudinal central axis of the pair of fixing ends.

The long-side support bar may have both sides having an asymmetric shape, based on the longitudinal central axis.

A plurality of protrusion portions may be arranged at a side of the long-side support bar and no protrusion portions are arranged at the other side of the long-side support bar.

The mask may be arranged to perpendicularly intersect with the long-side support bar.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
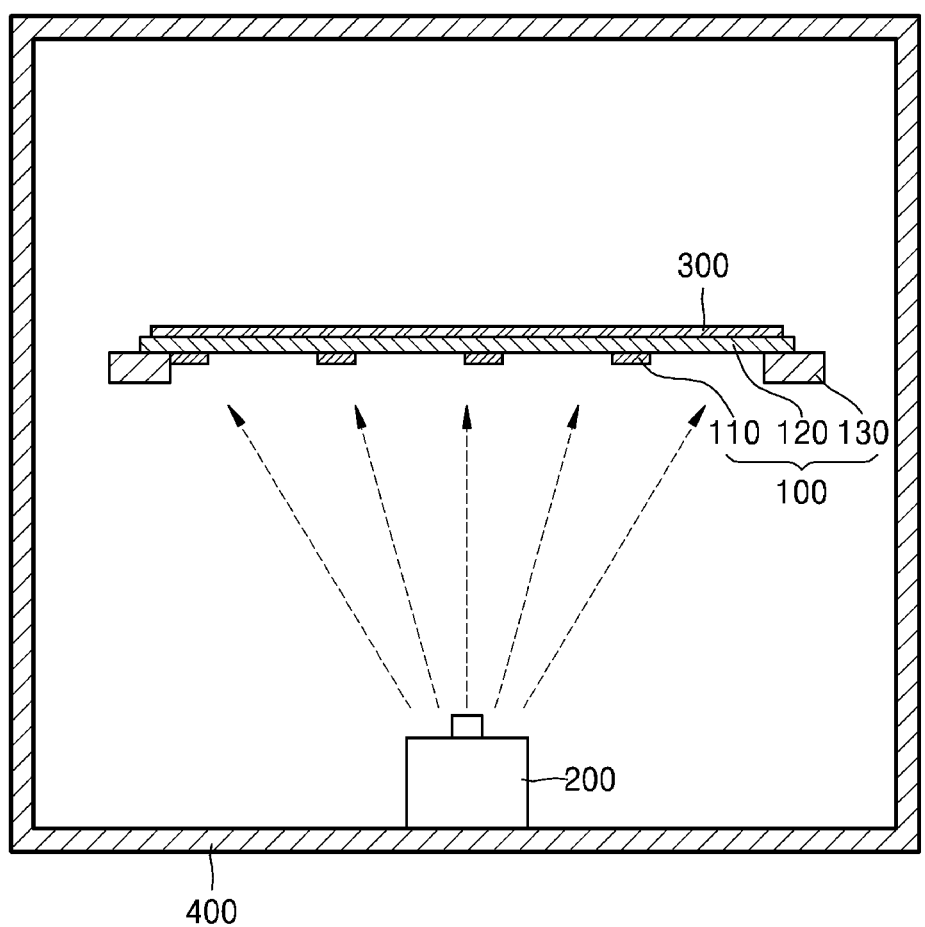
FIG. 1 illustrates a deposition process using a mask frame assembly according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 schematically illustrates a structure of a thin film deposition apparatus implementing a mask frame assembly 100 according to an exemplary embodiment.

As illustrated in FIG. 1, the thin film deposition apparatus may include the mask frame assembly 100 for forming an intended pattern on a substrate 300, on which deposition is to be performed, and a deposition source 200 for ejecting deposition gas toward the substrate 300 in a chamber 400.

That is, when the deposition source 200 ejects the deposition gas in the chamber 400, the deposition gas may pass through the mask frame assembly 100 and may be deposited on the substrate 300 to form a thin film having a certain pattern.

Figure 2:
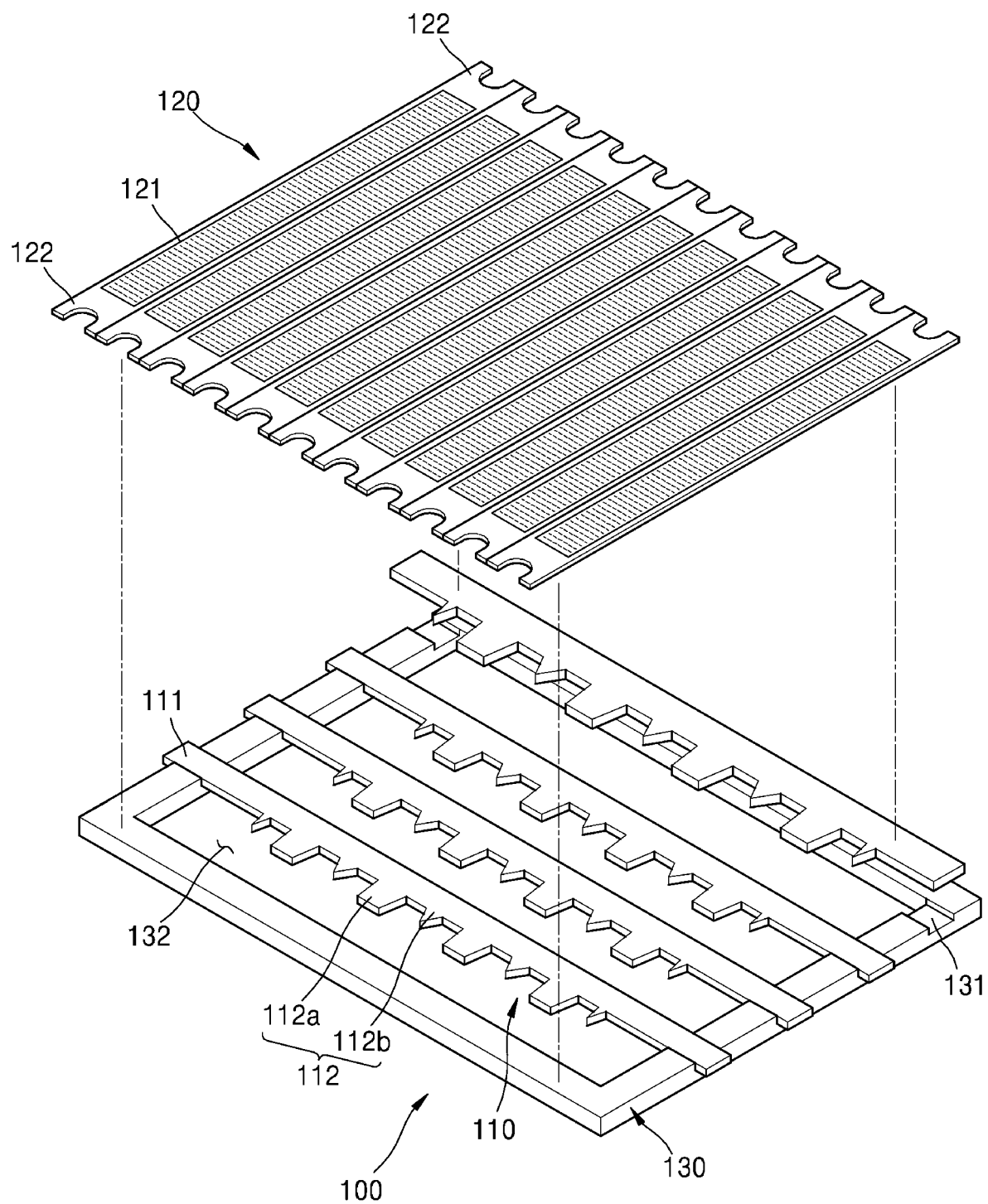
FIG. 2 is an exploded perspective view of the mask frame assembly illustrated in FIG. 1.

Here, the mask frame assembly 100 may have a structure in which a frame 130, a mask 120, and a long-side support bar 110 are coupled to one another, and its specific structure is as illustrated in FIG. 2.

Referring to FIG. 2, the mask frame assembly 100 according to the present exemplary embodiment may include the frame 130, a plurality of long-side support bars 110 each having both ends fixed on the frame 130, and a plurality of masks 120 perpendicularly intersecting with the plurality of long-side support bars 110 and each having both ends fixed on the frame 130.

The frame 130 may form an outer edge of the mask frame assembly 100 and may include an opening 132 in the middle thereof and have a shape of a quadrilateral. A coupling groove 131 may be formed in each of a pair of sides of the frame 130, the pair of sides facing each other, and a pair of fixing ends 111 at both sides of the long-side support bar 110 may be welded on the coupling grooves 131 and the both ends of each of the masks 120 may also be welded on a pair of sides perpendicular to the pair of sides on which the long-side support bar 110 is welded.

The masks 120 may include members each having a long support bar shape and may include a plurality of pattern areas 121 located in the opening 132, and the both ends of the masks 120 may be welded on the frame 130 as described above. Reference numeral 122 refers to a clamping portion, and when the masks 120 are welded on the frame 130, the welding operation may be performed by holding the clamping portion and pulling the clamping portion 122 in a longitudinal direction. The clamping portion 122 may be cut and removed after the welding operation. The masks 120 may be formed as one large member, but in that case, the masks 120 may be greatly sagged due to their own weight. Thus, the masks 120 may be formed by being divided into a plurality of support bar shapes as illustrated in FIG. 2. Materials of the masks 120 may include, for example, Ni, a Ni—Co alloy, etc.

The pattern areas 121 may be areas in which a plurality of pattern holes are formed, and during a deposition process, deposition steams may pass through the pattern holes to form a thin layer on the substrate 300 (refer to FIG. 1). The pattern areas 121 may not be divided into unit cell patterns. Rather, the pattern areas 121 may extend long as an integrated shape and may be divided into the unit cell patterns by the long-side support bar 110.

The long-side support bar 110 may include an about stainless steel (SUS) material and may include the pair of fixing ends 111 fixed in the coupling grooves 131 of the frame 130 via welding and a pattern division portion 112 connected between the pair of fixing ends 111. The pattern division portion 112 may have an asymmetric shape by including two sides with a side on which a plurality of protrusion portions 112a and 112b are provided and the other side which has a shape of a straight line with no protrusion portions. That is, since the unit cell pattern to be deposited has an asymmetric shape having a trench shape at a side thereof, the long-side support bar 110 dividing the unit cell pattern having that shape may be formed as the asymmetric shape. Here, the protrusion portion 112a may correspond to a trench area. The protrusion portion 112b may correspond to a distance between the unit cells.

The division of the unit cell patterns will be described in detail with reference to FIG. 3.

Figure 3:
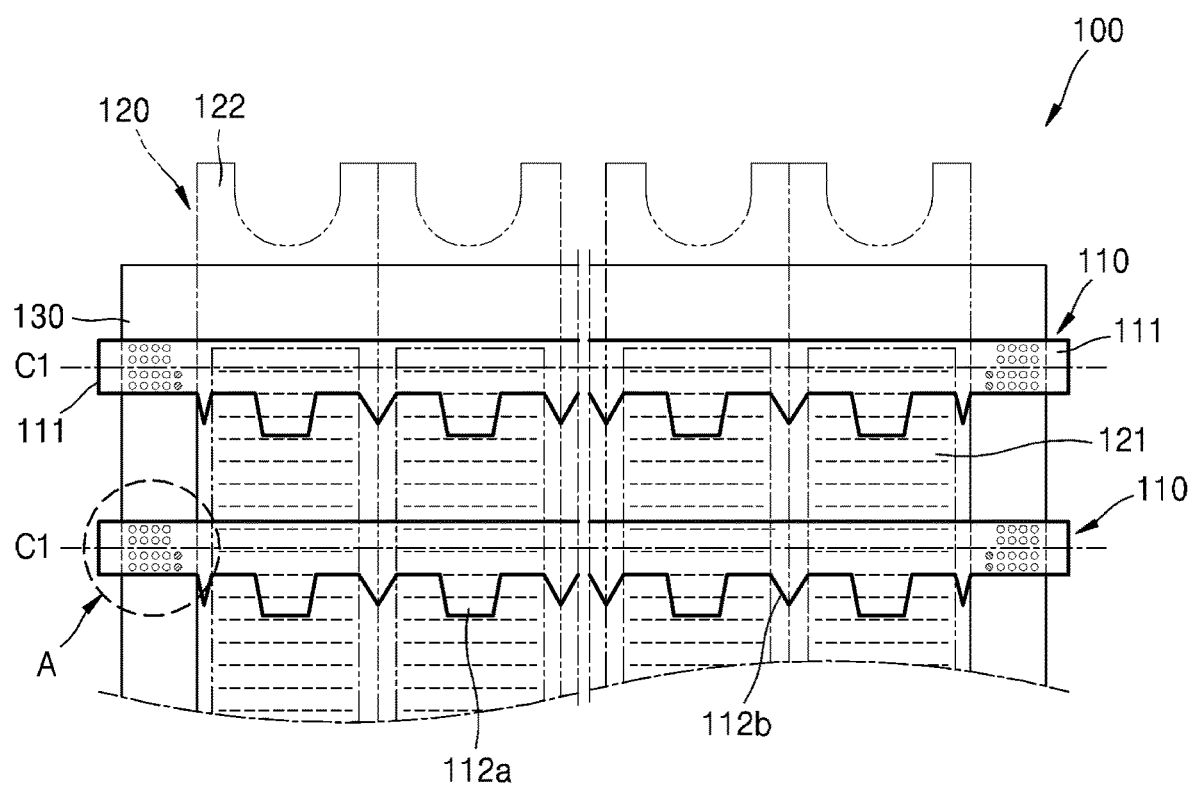
FIG. 3 is a partial plan view of the mask frame assembly illustrated in FIG. 2.

As illustrated in FIG. 3, the masks 120 and the long-side support bar 110 may be formed to connect to each other by perpendicularly intersecting with the frame 130. Accordingly, the pattern division portion 112 of the long-side support bar 110 may cross the pattern areas 121 of each mask 120, and the unit cell patterns may be divided according to the shape of the pattern division portion 112 including the protrusion portions 112a and 112b.

That is, the pattern division portion 112 may correspond to a boundary line between the unit cells and a location covered by the protrusion portion 112a may correspond to a trench area of the substrate 300.

Figure 4:
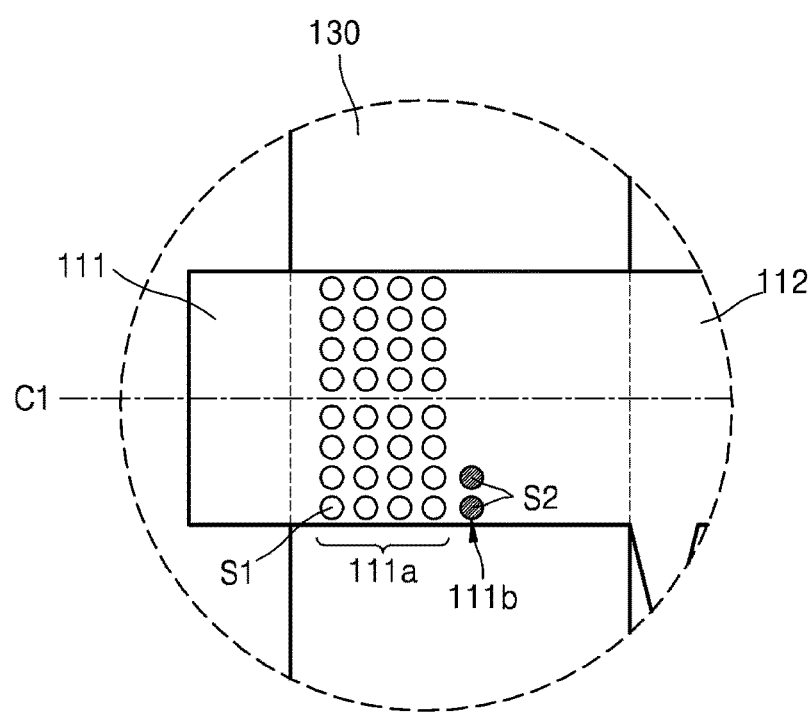
FIG. 4 is an enlarged plan view of a region A of FIG. 3.

Meanwhile, via spot welding, the pair of fixing ends 111 of the long-side support bar 110 may be fixed on the opposite sides of the frame 130, and a plurality of welds S1 and S2 may be formed as illustrated in FIG. 4.

An area of the pair of fixing ends 111, in which the plurality of welds S1 and S2 are formed, may include a symmetric welding portion 111a, in which the welds S1 are symmetrically arranged at both sides of the pair of fixing ends 111 based on a longitudinal central line C1, and an asymmetric welding portion 111b in which the welds S2 are arranged at only one side of the longitudinal central line C1.

The symmetric welding portion 111a may be a basic welding portion for welding and fixing the long-side support bar 110 on the frame 130 and the asymmetric welding portion 111b may be a correction welding portion for correcting bending deflection of the long-side support bar 110, the bending deflection occurring in the long-side support bar 110 during the operation of welding and fixing the long-side support bar 110 on the frame 130. That is, in the basic welding operation for fixing the long-side support bar 110 on the frame 130, the symmetric welding portion 111a may be formed by uniformly forming the welds S1 at both sides based on the longitudinal central line C1, and in the correction welding operation of the asymmetric welding portion 111b, a correction operation for deriving bending deflection in the opposite direction may be performed to offset the bending deflection occurring in the long-side support bar 110.

The bending correction principle of the asymmetric welding portion 111b is described below.

Figure 5:
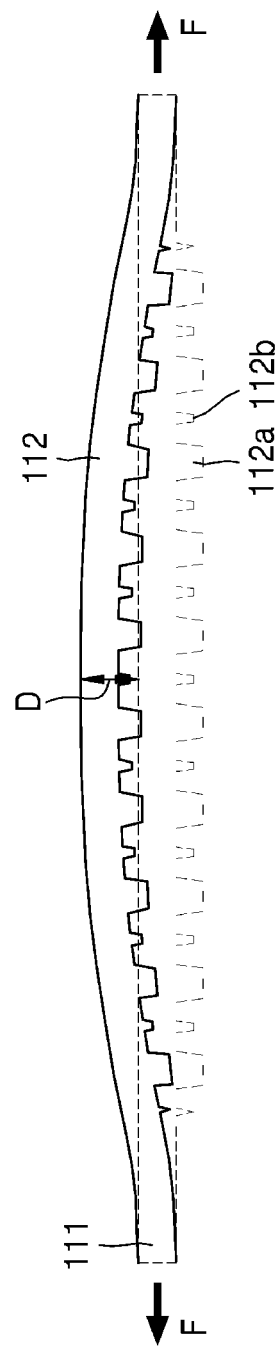
FIG. 5 is a plan view illustrating bending deflection of a long-side support bar illustrated in FIG. 2, the bending deflection occurring when the long-side support bar is pulled.

First, when the long-side support bar 110 is welded to the frame 130, the pair of fixing ends 111 of the long-side support bar 110 may be drawn and pulled tightly to perform the welding operation. Here, bending deflection may easily occur in the long-side support bar 110, whereby the long-side support bar 110 is bent in a direction as illustrated in FIG. 5. That is because the long-side support bar 110 has the asymmetric shape as described above. When the unit cells have square shapes, and thus, the long-side support bar 110 has a support bar shape by having the pattern division portion 112 having both surfaces each having a shape of a straight line, the long-side support bar 110 may not be easily bent due to force concentrated in any one direction, when the long-side support bar 110 is pulled in a longitudinal direction, since the straight support bar has a symmetric structure itself.

However, when the long-side support bar 110 has the asymmetric shape by including a side on which the protrusion portions 112a and 112b are provided and the other side having the shape of a straight line, according to the present exemplary embodiment, bending deflection may easily occur when the long-side support bar 110 is pulled for welding. That is, rigidity balance between the both sides may be destroyed, and thus, when the long-side support bar 110 is pulled in a longitudinal direction, the long-side support bar 110 may be easily bent to have a convex shape in one direction as illustrated in FIG. 5. Here, a degree D of bending deflection may correspond to a distance between a straight line, which refers to the state of a side surface of the long-side support bar 110 when the side surface is not bent, and a point to which the side surface of the long-side support bar 110 is bent to have the convex shape.

Such bending deflection may occur not only when the long-side support bar 110 is pulled, but also when spot welding is performed. That is, the bending deflection may occur in the long-side support bar 110 via the welding operation for fixing the pair of fixing ends 111 on the frame 130. Here, in the case of the symmetric welding portion 111a, the welds S1 are formed at both sides based on the longitudinal central line C1, and thus, bending deflection in any one direction may rarely occur. However, when the welds S2 are formed at only one side of the central line C1 as in the asymmetric welding portion 111b, the bending deflection may occur in the long-side support bar 110. By using this principle, the bending deflection occurring in the pulling process may be corrected via the asymmetric welding portion 111b.

Figure 6:
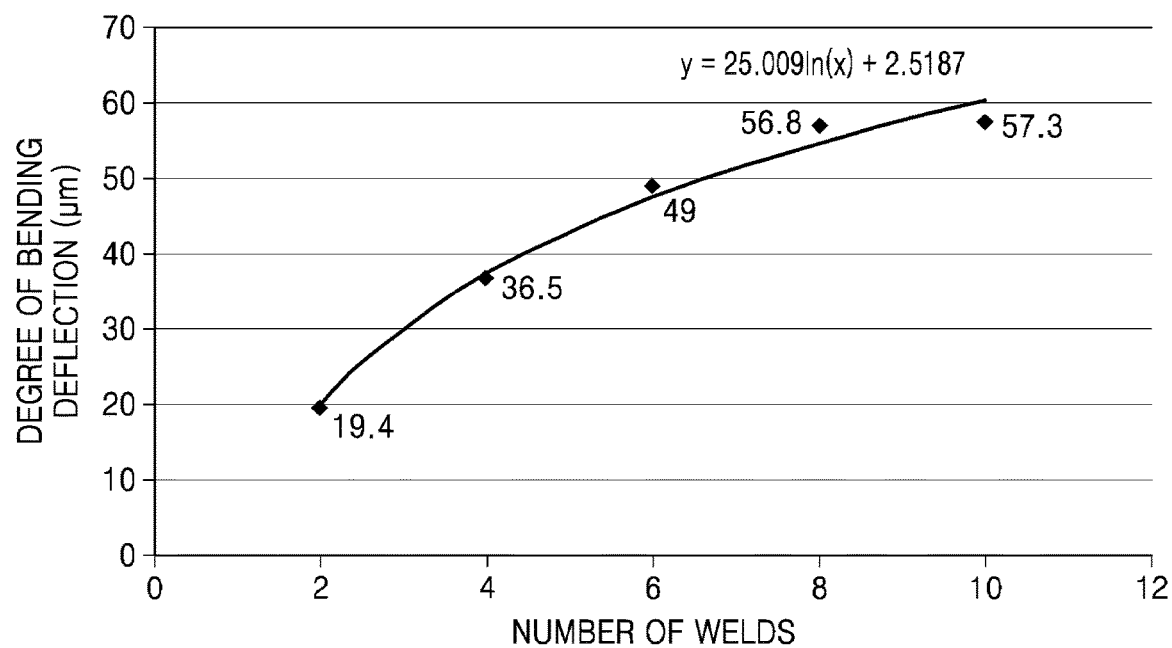
FIG. 6 is a graph showing a relationship between a degree of bending deflection of the long-side support bar illustrated in FIG. 5 and the number of welds for correcting the bending deflection.

FIG. 6 illustrates a result of measuring the degree of bending deflection of the long-side support bar 110 based on the number of welds S2 formed in the asymmetric welding portion 111b, which may be represented as y=25.009 ln (x)+2.5187 [y: the degree of bending deflection (μm), x: the number of asymmetric welds] by using a numerical formula. That is, it denotes that when two asymmetric welds S2 are formed, bending correction of about 20 μm may be performed and when four asymmetric welds S2 are formed, bending correction of about 40 μm may be performed.

For example, when the degree D of bending deflection of the long-side support bar 110 is identified as about 40 μm in FIG. 5, four welds S2 may be formed at the fixing end 111 of the pair of fixing ends 111, which is bent to be convex based on the longitudinal central line C1. By doing so, the bending deflection occurring due to the pulling process may be corrected via the asymmetric welding portion 111b, and thus, the long-side support bar 110 may be provided to have the shape of a straight line having little bending. Even if the degree D of bending deflection may not be perfectly zero, deposition quality may meet demands when the degree D of bending deflection is reduced to 30 μm.

Thus, the bending deflection of the long-side support bar 110 may be corrected by using this method to secure deposition quality. Also, while, as in the above example, four asymmetric welds S2 may be formed at once, the asymmetric welds S2 may be eventually formed one-by-one by checking a change in the degree of bending deflection.

A process of assembling the mask frame assembly 100, the process including the welding operation of the long-side support bar 110, will be described below. First, an example of an object, on which deposition may be performed by using the mask frame assembly 100, will be briefly described with reference to FIG. 7.

The mask frame assembly 100 may be used for various thin film depositions. For example, the mask frame assembly 100 may be used to form a pattern of an emission layer of an organic light-emitting display apparatus.

Figure 7:
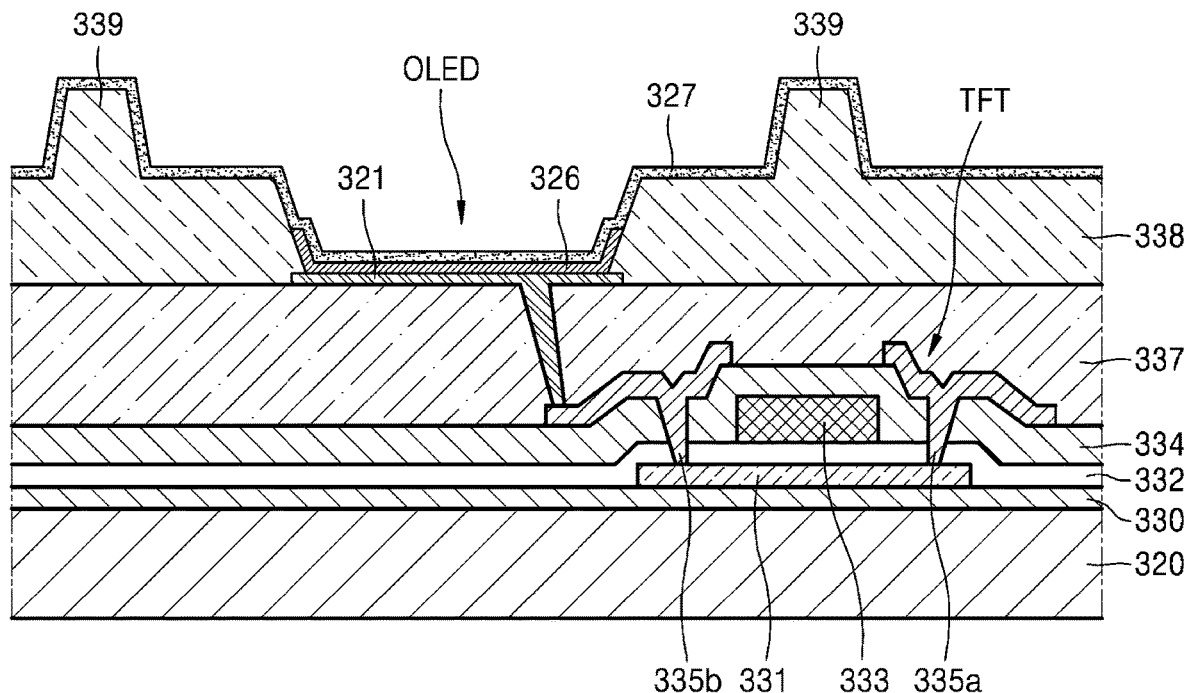
FIG. 7 is a cross-sectional view of a specific structure of a substrate illustrated in FIG. 1.

FIG. 7 illustrates a structure of the organic light-emitting display apparatus, which is an example including the substrate 300 on which deposition may be performed by using the mask frame assembly 100 according to the present disclosure.

Referring to FIG. 7, a buffer layer 330 may be formed on a base substrate 320, and a thin film transistor TFT may be provided above the buffer layer 330.

The thin film transistor TFT may have an active layer 331, a gate insulating layer 332 formed to cover the active layer 331, and a gate electrode 333 above the gate insulating layer 332.

An interlayer insulating layer 334 may be formed to cover the gate electrode 333 and a source electrode 335a and a drain electrode 335b may be formed above the interlayer insulating layer 334.

The source electrode 335a and the drain electrode 335b may contact a source area and a drain area of the active layer 331, respectively, via a contact hole formed in the gate insulating layer 332 and the interlayer insulating layer 334.

Also, a pixel electrode 321 of an organic light-emitting device OLED may be connected to the drain electrode 335b. The pixel electrode 321 may be formed above a planarization layer 337, and a pixel defining layer 338 for defining sub-pixel areas may be formed above the pixel electrode 321. Reference numeral 339 indicates a spacer for maintaining a distance between members at the side of the substrate 300 and the mask 120 during a deposition process, thereby preventing damage to the members at the side of the substrate 300 due to contact with the mask 120, and the spacer 339 may be formed in a shape in which a portion of the pixel defining layer 338 protrudes. Also, an emission layer 326 of the organic light-emitting device OLED may be formed in an opening of the pixel defining layer 338, and an opposite electrode 327 may be deposited above the opening of the pixel defining layer 338 and the emission layer 326 of the organic light-emitting device OLED. That is, the opening surrounded by the pixel defining layer 338 may be an area of a sub-pixel, such as a red pixel R, a green pixel G, and a blue pixel B, and the emission layer 326 of a corresponding color may be formed in the area of the sub-pixel.

Thus, when the mask frame assembly 100 is prepared such that the pattern holes of the pattern areas 121 correspond to the emission layer 326, the emission layer 326 having an intended pattern may be formed via the deposition process described above with reference to FIG. 1. Also, the unit cell described above may correspond to a display area of an organic light-emitting display apparatus.

FIGS. 8A through 8D sequentially illustrate a process of manufacturing the mask frame assembly 100, the process including the welding of the long-side support bar 110 described above.

Figure 8A:
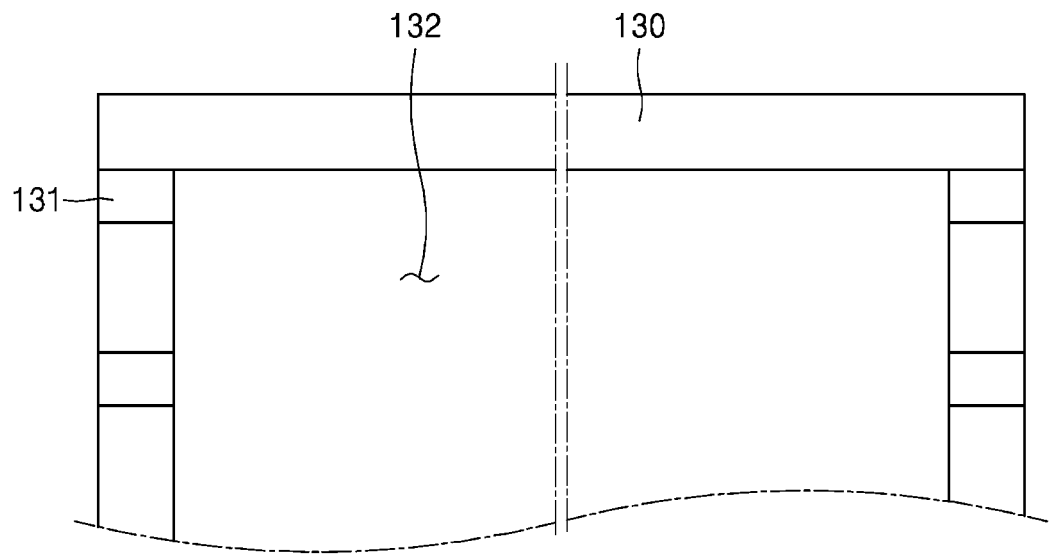
FIGS. 8A, 8B, 8C, and 8D are plan views illustrating a process of manufacturing the mask frame assembly illustrated in FIG. 2.

First, the frame 130 having the opening 132 in the middle thereof and having the coupling grooves 131 at two sides facing each other from among four sides of the frame 130 may be prepared, as illustrated in FIG. 8A.

Figure 8B:
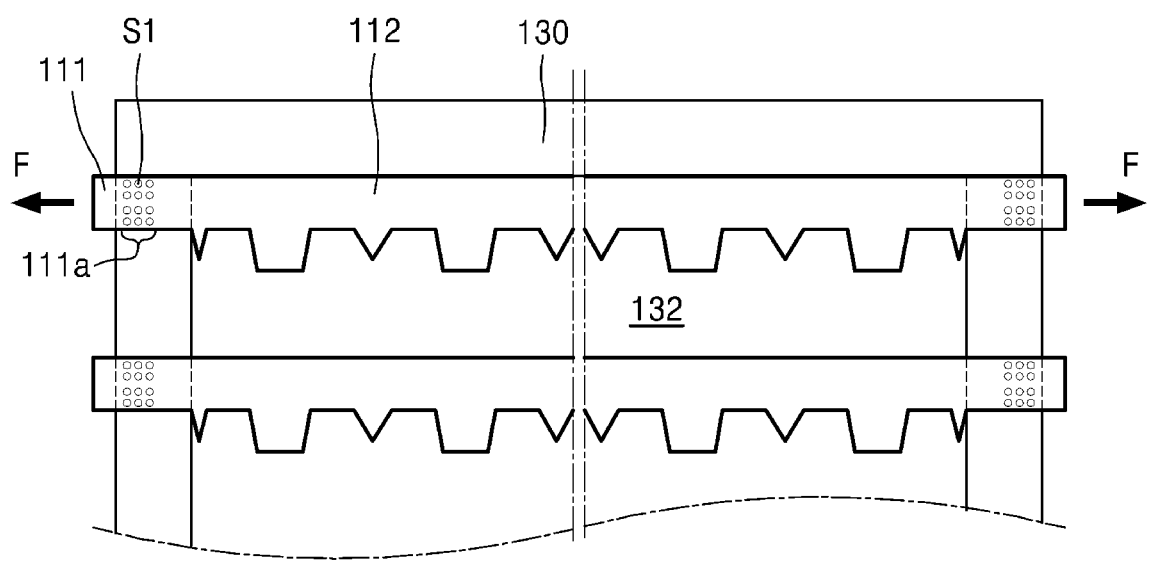
Figure 8C:
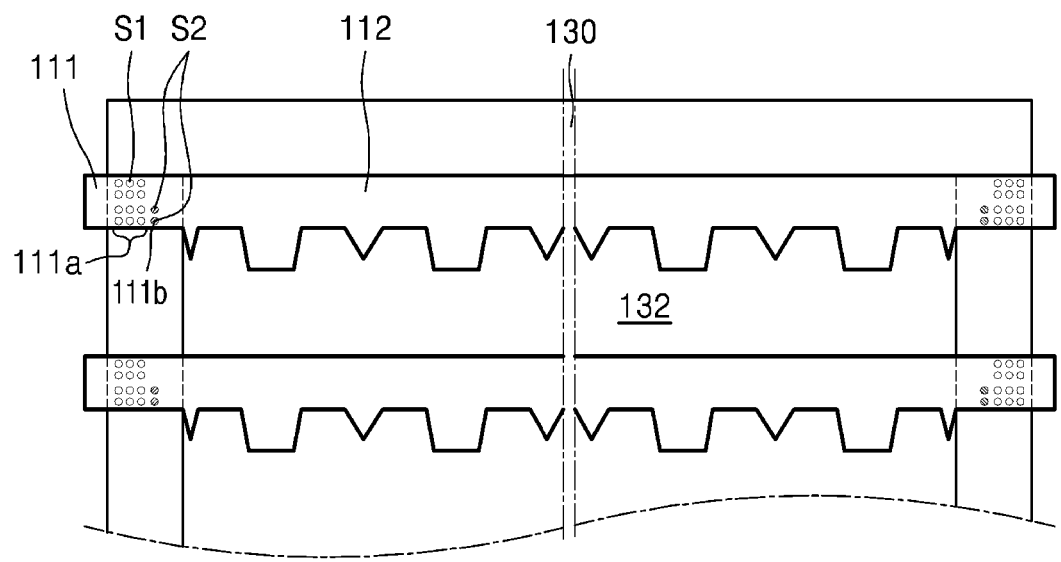

Next, the long-side support bars 110 may be welded and fixed to the frame 130 as illustrated in FIG. 8B. That is, in a state in which the pair of fixing ends 111 of each long-side support bar 110 are held and a pulling force F is applied thereto in a longitudinal direction, the pair of fixing ends 111 may be welded and fixed to the coupling groove 131. Here, only the welds S1 of the symmetric welding portion 111a may be formed to perform a basic fixing operation.

In this state, an operation of measuring the degree D of bending deflection of the long-side support bar 110 may be performed. The measurement may be automatic measurement using a camera or manual measurement performed by an operator.

When correction is needed based on the measurement, the number of welds S2 that are needed for the asymmetric welding portion 111b may be calculated based on the formula of the graph illustrated in FIG. 6 and the welds S2 corresponding to the number may be formed. Here, the welds S2 corresponding to the number may be formed at once or may be formed one-by-one by checking the change in the degree of bending deflection D, as described above.

Also, even if the welds S2 corresponding to the needed number are formed at once, re-inspection may be performed to check whether the degree D of bending deflection has been reduced within a preset permitted range, for example, within 30 μm. When the degree D of bending deflection has not been reduced within the preset permitted range, the number of welds S2 additionally needed for the asymmetric welding portion 111b may be calculated based on the formula of the graph illustrated in FIG. 6, and the welds S2 corresponding to the number may be additionally formed. By using this process, even if the degree D of bending deflection has not been reduced within the preset permitted range at once, correction may be gradually performed.

However, correction may not be limitlessly repeated, and when there comes a time point in which the central line C1 has to be passed beyond in order to satisfy the number of welds S2 to be additionally formed, correction may no longer be performed and a defect signal may be sent to an operator. That is, the asymmetric welds S2 may be formed in the fixing ends 111 in an order that follows the width direction, as illustrated in FIG. 4, and when there comes the time point in which the central line C1 has to be passed beyond to add the asymmetric welds S2, bending in the opposite direction may be induced. Thus, the correction limit may be set such that the central line C1 is not passed beyond, and the asymmetric welds S2 may be formed within the condition.

Figure 8D:
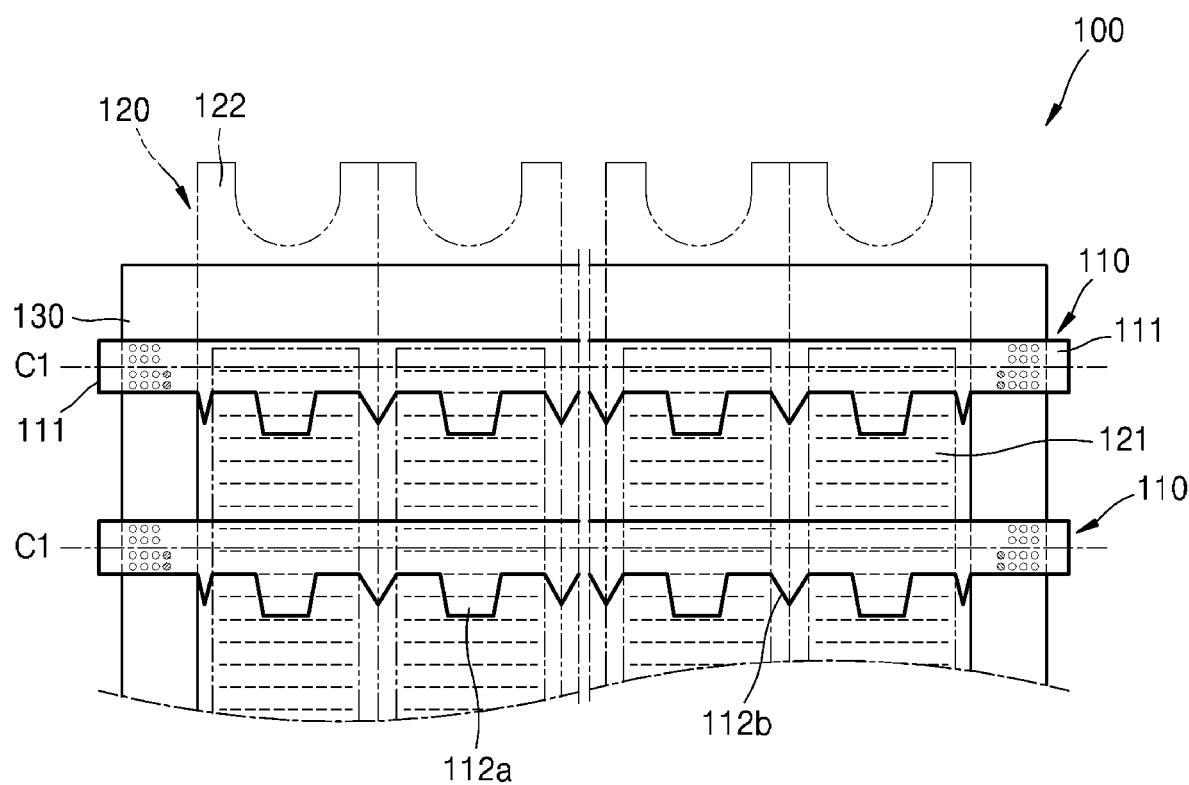

After the long-side support bars 110 are welded based on this method, the masks 120 may be welded and fixed on the frame 130 to perpendicularly intersect with the long-side support bars 110, as illustrated in FIG. 8D. That is, the clamping portion 122 of each mask 120 may be held and pulled in a longitudinal direction of the mask 120, and in this state, the mask 120 may be welded and fixed on the frame 130. The clamping portion 122 may be cut and removed after the welding operation, and based on the same operation, a portion of the long-side support bar 110, the portion protruding outside the edge of the frame 130, may be cut and removed after the welding operation.

By using this process, the mask frame assembly 100 in which deflection of the long-side support bar 110 is corrected may be formed.

Figure 9:
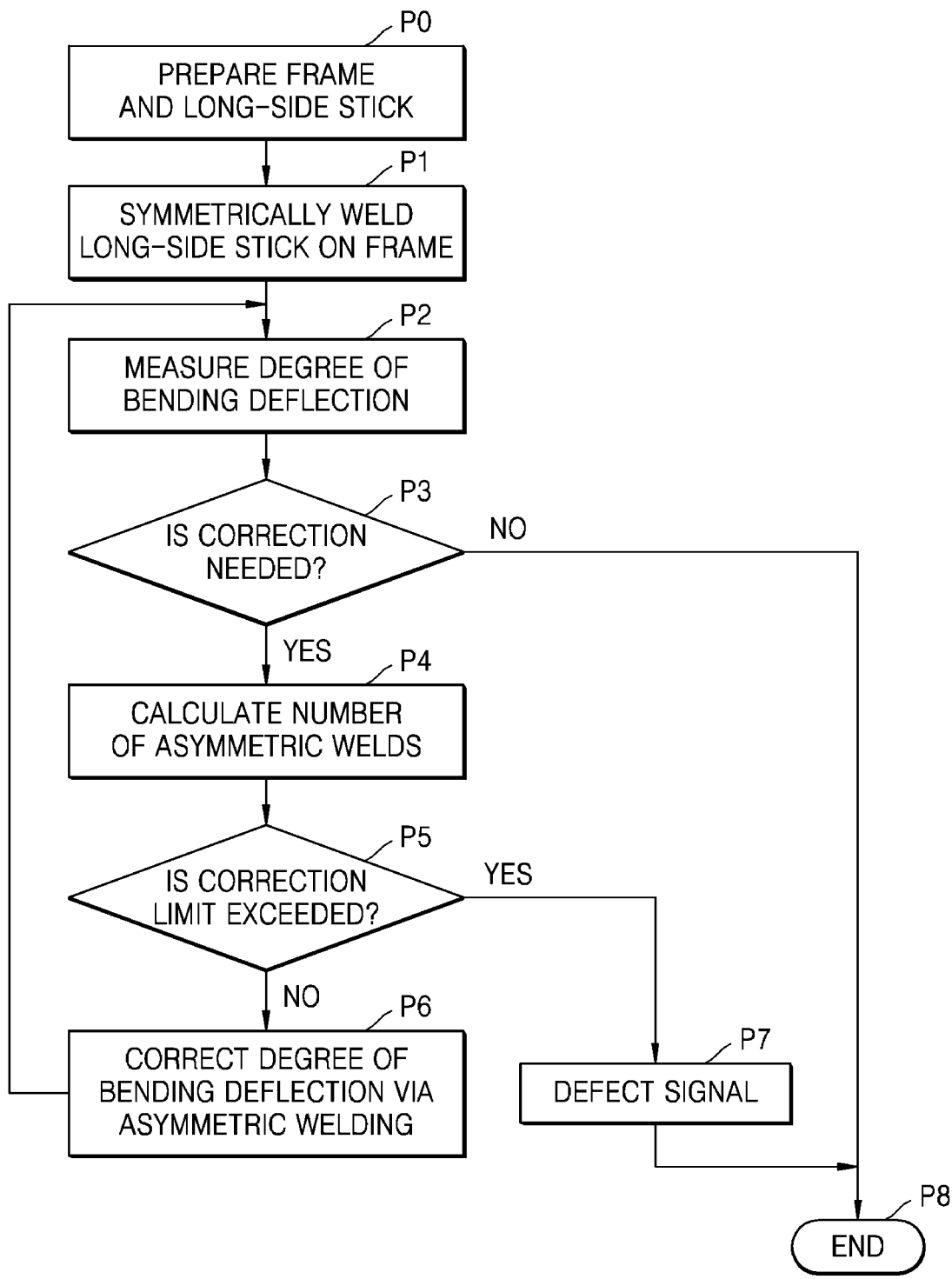
FIG. 9 is a flowchart of a process of welding a long-side support bar during the process of manufacturing the mask frame assembly of FIGS. 8A through 8D.

FIG. 9 is a flowchart for convenience of understanding, wherein the flowchart is generated by extracting a welding process of the long-side support bar 110 from the process of manufacturing the mask frame assembly 100 described above.

With respect to the welding process of the long-side support bar 110 with reference to FIG. 9, first, the frame 130 and the long-side support bar 110 may be prepared (P0), and a tensile force may be applied to the pair of fixing ends 111 of the long-side support bar 110 to form the symmetric welding portion 111a and the symmetric welding portion 111a may be fixed on the frame 130 (P1).

Thereafter, the degree D of bending deflection of the long-side support bar 110 may be measured (P2), and when it is determined (P3) that correction is needed, the number of asymmetric welds S2 needed may be calculated based on the formula of the graph of FIG. 6 (P4).

Then, whether the formation of the calculated number of asymmetric welds S2 exceeds the correction limit or not may be checked (P5), and when the formation of the calculated number of asymmetric welds S2 exceeds the correction limit, a defect signal may be transmitted to an operator (P7) and the operation may be ended (P8), and when the formation of the calculated number of asymmetric welds S2 does not exceed the correction limit, the calculated number of asymmetric welds S2 may be formed in the fixing ends 111.

Thereafter, the degree of bending deflection may be measured again (P2) to check whether the degree of bending deflection has come to be within a permitted range, and when no further correction is needed, the welding of the long-side support bar 110 may be rightly ended (P8). However, when the degree of bending deflection has not come to be within the permitted range, the operation of adding the asymmetric welds S2 and checking the degree of bending deflection may be repeated until the correction limit is met.

Based on this method, the bending of the long-side support bar 110 may be corrected.

Figure 10:
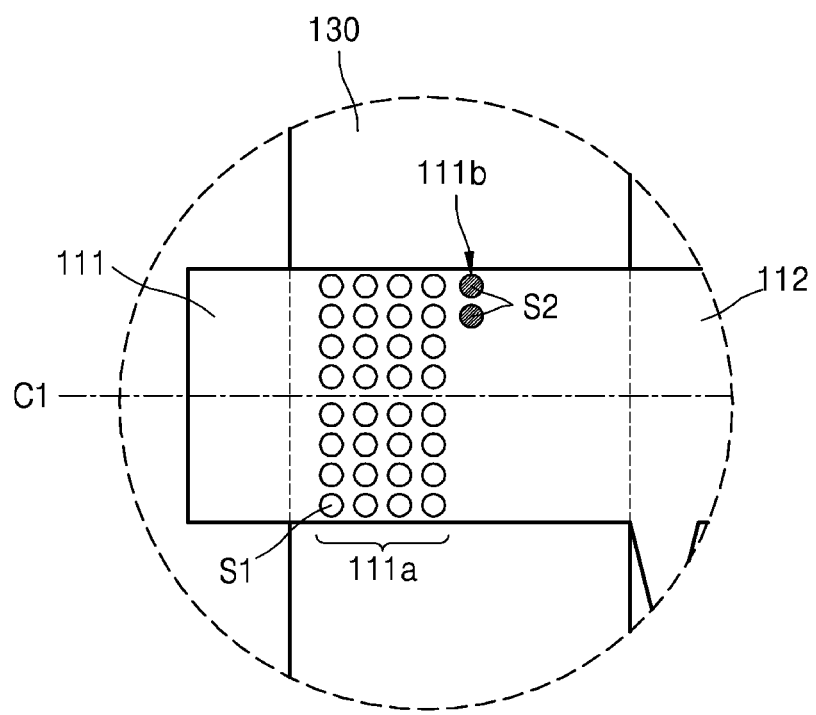
FIG. 10 is a plan view for describing a method of correcting bending deflection of a long-side support bar, according to a modified exemplary embodiment.

Meanwhile, according to the exemplary embodiment described above, the case is described, in which the long-side support bar 110 is bent to be convex in a direction opposite to the side surface at which the protrusion portions 112a and 112b are provided as illustrated in FIG. 5. However, a case in which the long-side support bar 110 is bent in an opposite direction may be also possible. In this case, as illustrated in FIG. 10, the asymmetric welds S2 may be formed at a side opposite to the side illustrated in FIG. 4.

Further, according to the present exemplary embodiment, the process in which first the long-side support bars 110 are welded on the frame 130 and the masks 120 are perpendicularly welded thereon is described as an example. However, first the masks 120 may be welded on the frame 130, and then, the long-side support bars 110 may be welded thereon. That is, the order in which the masks 120 and the long-side support bars 110 are welded may be changed.

Therefore, according to the mask frame assembly and the method of manufacturing the same described above, the deflection of the long-side support bars for dividing the pattern areas of the masks into the unit cell patterns may be sufficiently corrected, and thus, when the mask frame assembly is used for a deposition process, intended patterns may be always deposited on a precise location of a substrate and a stable quality of a product may be obtained.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A method of manufacturing a mask frame assembly, the method comprising the steps of:
   welding fixing ends of a long-side support bar on a frame; and
   fixing a mask having a pattern area to be divided by the long-side support bar, on the frame,
   wherein the welding of the fixing ends of the long-side support bar on the frame comprises:
   forming a first group of welds symmetrically on both sides of a longitudinal central axis of the fixing ends; and
   forming a second group of welds asymmetrically with respect to the longitudinal central axis of the fixing ends by forming one or more asymmetric welds on only one side of the longitudinal central axis of the fixing ends.

2. The method of claim 1, wherein the step of welding of the fixing ends of the long-side support bar on the frame further comprises measuring a degree of bending deflection of the long-side support bar, and
   the step of forming of the second group of welds asymmetrically with respect to the longitudinal central axis of the fixing ends is performed to correct the degree of bending deflection.

3. The method of claim 2, further comprising the step of:
   calculating a number of asymmetric welds for correcting the measured degree of bending deflection; and
   the step of forming of the second group of welds asymmetrically with respect to the longitudinal central axis of the fixing ends is performed according to the calculated number of asymmetric welds.

4. The method of claim 3, wherein the step of calculating of the number of asymmetric welds for correcting the measured degree of bending deflection comprises:
   calculating the number of asymmetric welds based on $y=25.009 \ln(x)+2.5187$, wherein y is the degree of bending deflection, and x is the number of asymmetric welds.

5. The method of claim 3, wherein the step of measuring of the degree of bending deflection of the long-side support bar, the step of calculating of the number of asymmetric welds for correcting the measured degree of bending deflection, and the step of forming of the second group of welds asymmetrically with respect to the longitudinal central axis of the fixing ends are repeatedly performed a plurality of times to gradually correct the degree of bending deflection.

6. The method of claim 5, further comprising the step of:
   generating a defect signal when the number of asymmetric welds to be formed exceeds a pre-set correction limit based on the measuring of the degree of bending deflection of the long-side support bar.

7. The method of claim 6, further comprising the step of:
   when the asymmetric welds are formed beyond the longitudinal central axis of the fixing ends, determining that the pre-set correction limit is exceeded to end a welding operation.

8. The method of claim 7, wherein the asymmetric welds are formed in an order corresponding to a width direction of the fixing ends.

9. The method of claim 8, wherein the step of measuring of the degree of bending deflection is performed after the step of forming of the first group of welds symmetrically with respect to the longitudinal central axis of the fixing ends.

10. The method of claim 1, wherein the long-side support bar has opposite sides having an asymmetric shape with respect to the longitudinal central axis.

11. The method of claim 10, wherein the step of welding of the fixing ends of the long-side support bar on the frame further comprises the step of pulling the long-side support bar having the asymmetric shape and welding the long-side support bar on the frame.

12. The method of claim 1, wherein the step of welding of the fixing ends of the long-side support bar on the frame comprises the step of mounting the mask to perpendicularly intersect with the long-side support bar.

* * * * *